(12) United States Patent
Wang

(10) Patent No.: US 10,483,794 B2
(45) Date of Patent: Nov. 19, 2019

(54) POWER CONTINUATION CONTROL CIRCUIT

(71) Applicant: NANNING FUGUI PRECISION INDUSTRIAL CO., LTD., Nanning (CN)

(72) Inventor: Yi-Feng Wang, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 65 days.

(21) Appl. No.: 15/635,209

(22) Filed: Jun. 28, 2017

(65) Prior Publication Data

US 2019/0006880 A1   Jan. 3, 2019

(51) Int. Cl.
*H02J 9/06* (2006.01)
*H02J 7/00* (2006.01)
*H03K 4/06* (2006.01)

(52) U.S. Cl.
CPC ............ *H02J 9/061* (2013.01); *H02J 7/0052* (2013.01); *H02J 7/0063* (2013.01); *H03K 4/06* (2013.01)

(58) Field of Classification Search
CPC ........ H02J 9/061; H02J 7/0052; H02J 7/0063; H03K 4/06
See application file for complete search history.

(56) References Cited

U.S. PATENT DOCUMENTS

| 4,827,366 A  * | 5/1989 | McNally | H02H 7/12 323/276 |
| 2011/0234255 A1* | 9/2011 | Chobot | G01R 31/40 324/764.01 |

FOREIGN PATENT DOCUMENTS

| CN | 1472864 A | 2/2004 |
| CN | 102480169 A | 5/2012 |
| CN | 103293980 A | 9/2013 |
| CN | 204855627 U | 12/2015 |

* cited by examiner

*Primary Examiner* — Rexford N Barnie
*Assistant Examiner* — Terrence R Willoughby
(74) *Attorney, Agent, or Firm* — ScienBiziP, P.C.

(57) ABSTRACT

A power continuation control circuit includes a power supply circuit, a detection circuit, an energy storage circuit, a switch module, and a control circuit. The detection circuit is coupled to the power supply circuit. The switch module is coupled to the energy storage circuit. The control circuit is coupled to the switch module and the detection circuit. The power supply output terminal is coupled to the control circuit and the power supply circuit.

10 Claims, 4 Drawing Sheets

POWER CONTINUATION CONTROL CIRCUIT

FIELD

The subject matter herein generally relates to a power supply circuit, and particularly to a power continuation control circuit.

BACKGROUND

Switches and information products sometimes need to get more power than the product to which they are connected can supply. In this case, we usually use an external power supply to expand the power to the external products. For example, Power Over Ethernet (PoE) switches and External Power Supply (EPS) products. PoE Switch with the EPS product can increase the power supply capacity of PoE switch, such as: PoE Switch have 48 ports and can support 12 PoE ports, and each Port can supply 30 W, but it would support 24 PoE ports or 48 PoE ports if connected with the EPS products. However, when EPS cable cannot supply power to the switch system due to failure, the switch system will not be able to provide the power provided by the original system and EPS products, causing system overload, so that the system stops operation.

BRIEF DESCRIPTION OF THE DRAWINGS

Implementations of the present technology will now be described, by way of example only, with reference to the attached figures.

DETAILED DESCRIPTION

Figure 1:
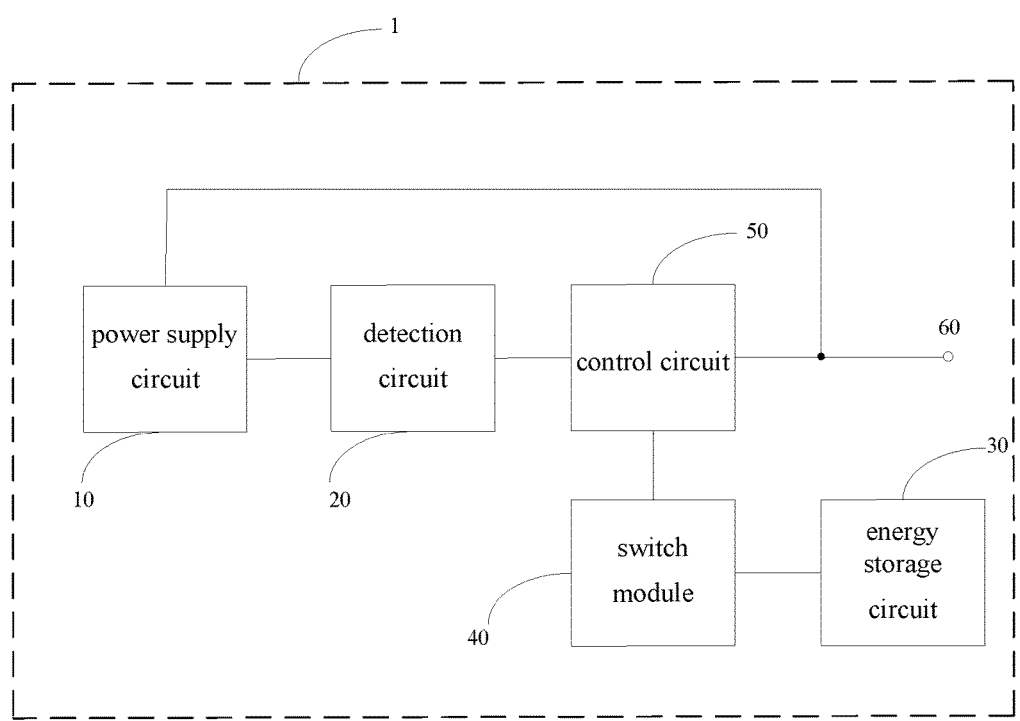
FIG. 1 is a block diagram of an embodiment of a power continuation control circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

The disclosure is described in relation to a power continuation control circuit.

FIG. 1 illustrates a block diagram of an embodiment of a power continuation control circuit 1. In at least one embodiment, the power continuation control circuit 1 comprises a power supply circuit 10, a detection circuit 20, an energy storage circuit 30, a switch module 40, a control circuit 50, and a power supply output terminal 60.

In at least one embodiment, the power supply circuit 10 is configured to output a preset voltage. In at least one embodiment, the preset voltage is 54V, the power supply circuit 10 takes EPS products as a example, not as a limitation. EPS products supply power to external devices (such as Switch PoE devices) through an EPS wire, which increases the power supply capacity of the PoE switch. The detection circuit 20 is coupled to the power supply circuit 10. The detection circuit 20 obtains the voltage outputted by the power supply circuit 10 to determine whether the power supply circuit is powered normally. When the detection circuit 20 detects that the power supply circuit 10 is powered abnormally, the detection circuit 20 outputs a first signal. When the detection circuit 20 detects that the power supply circuit 10 is powered normally, the detection circuit 20 outputs a second signal. In at least one embodiment, the first signal is a low level '0', the second signal is a high level '1'. In other embodiments, the first signal may also be a high level '1', the second signal is a low level '0'. The energy storage circuit 30 is coupled to the switch module 40. The energy storage circuit 30 is configured to store energy. The switch module 40 comprises a first electronic switch Q1 and a second electronic switch Q2. The first electronic switch Q1 can be a field effect transistor or a triode, and the second electronic switch Q2 can be a field effect transistor or a triode. In at least one embodiment, the first electronic switch Q1 and the second electronic switch Q2 are respectively a first MOS tube Q1 and a second MOS tube Q2, as examples. The control circuit 50 is coupled to the switch module 40 and the detection circuit 20. The control circuit 50 is configured to output a first square wave signal with a first preset duty ratio according to the second signal received by the detection circuit 20, to control the first electronic switch Q1 and the second electronic switch Q2 to turn on or off, resulting in the energy storage circuit storing and not distributing energy. The control circuit 50 is further configured to output a second square wave signal with a second preset duty ratio according to the first signal received by the detection circuit 20, to control the first electronic switch Q1 and the second electronic switch Q2 to turn on or off so that the energy storage circuit supplies or outputs stored energy. In at least one embodiment, the first electronic switch Q1 and the second electronic switch Q2 cannot be simultaneously turned on or turned off. The power supply output terminal 60 is coupled to the control circuit 50 and the power supply circuit 10. The power supply output terminal 60 supplies power to an external device.

Figure 2:
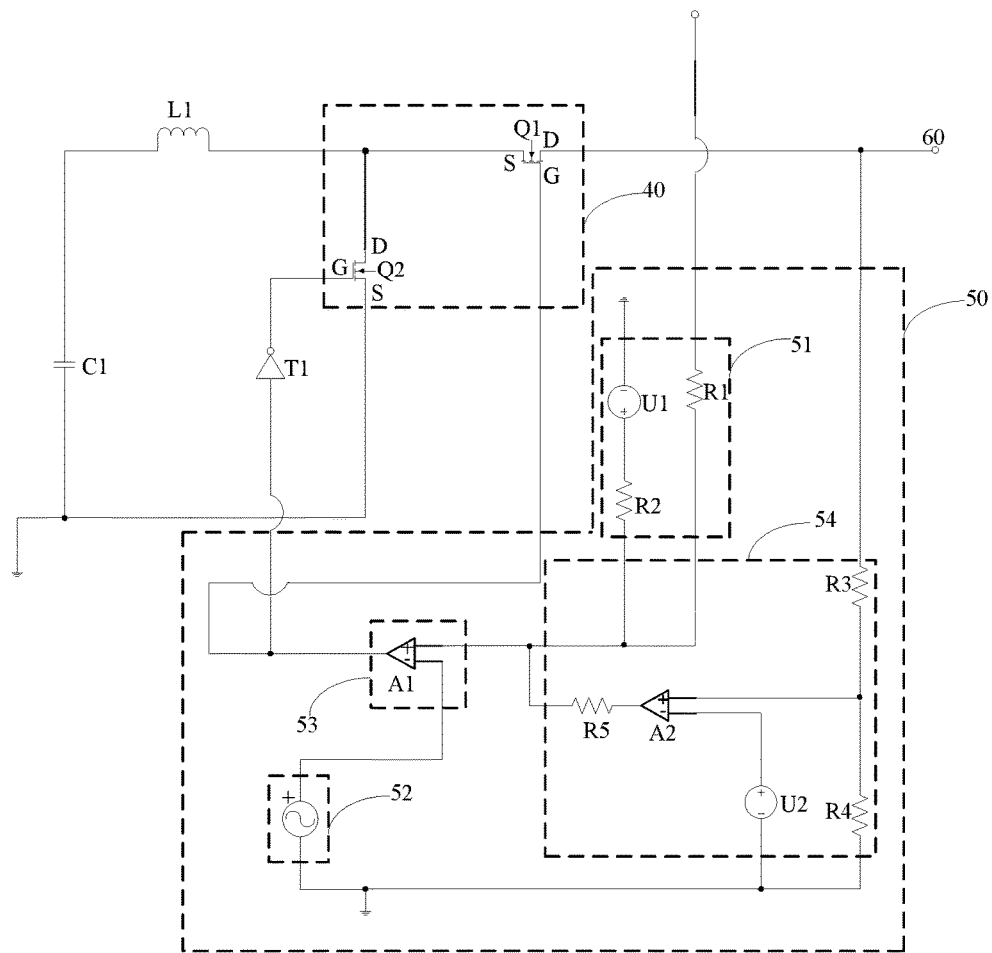
FIG. 2 is a circuit diagram of an embodiment of a control center of the control circuit of FIG. 1.

FIG. 2 illustrates a circuit diagram of an embodiment of the control circuit 50. In at least one embodiment, the control circuit 50 comprises a DC voltage output unit 51, a triangle wave generator 52, and a voltage comparison unit 53. The DC voltage output unit 51 is coupled to the detection circuit 20. The DC voltage output unit 51 outputs a first voltage signal when the first signal is outputted by the detection circuit 20 and outputs a second voltage signal when the second signal is outputted by the detection circuit 20. The triangle wave generator 52 is configured to produce a triangular wave with preset amplitude and frequency. In at least one embodiment, the preset amplitude is 5V and the preset frequency is 100 KHz. The first voltage signal is a DC voltage signal of an arbitrary value in the range of 2.5V to 5V, such as a DC voltage signal having an amplitude of 4.0V. The second signal is a DC voltage signal having an amplitude of 2.5V. The voltage comparison unit 53 is coupled to the triangle wave generator 52 and the DC voltage output unit 51. The voltage comparison unit 53 is configured to compare the voltage signal outputted by the DC voltage output unit 51 with the triangular wave. The voltage comparison unit 53 is further configured to output the square wave signal with the first preset duty ratio or the square wave signal with the second preset duty ratio according to the result of comparison, so that the energy storage 30 stores energy or supplies energy.

In at least one embodiment, the energy storage circuit 30 comprises an inductor L1 and a capacitor C1. The inductor L1 comprises an inductor first terminal and an inductor second terminal. The capacitor C1 comprises an inductor first terminal and an inductor second terminal. The capacitor C1 first terminal is coupled to the inductor L1 first terminal, the capacitor C1 second terminal is coupled to ground, the inductor L1 second terminal is coupled to switch module 40. The voltage comparison unit 53 comprises a first comparator A1. The first comparator A1 comprises a first voltage comparator A1 positive input terminal, a first voltage comparator A1 reverse input terminal, and a first voltage comparator A1 output terminal. The DC voltage output unit 51 comprises a first resistor R1, a first DC voltage source U1, and a second resistor R2. The first resistor R1 comprises a first resistor R1 first terminal and a first resistor R1 second terminal. The second resistor R2 comprises a second resistor R2 first terminal and a second resistor R2 second terminal. The first voltage comparator A1 is configured to compare the voltage value of the positive input terminal and the reverse input terminal in order to output a square wave of the preset duty ratio. In at least one embodiment, the output voltage of the first DC voltage source U1 is 5V. Further, in order to ensure that the energy storage circuit 30 supplies power in a stable manner to the external device, the control circuit 50 further comprises a first detection circuit 54. The first detection circuit 54 is coupled to the first voltage comparator A1 positive input terminal. The first detection circuit 54 is configured to detect a voltage value of the power supply output terminal 50 and to adjust the voltage value of the first voltage comparator positive input terminal according to a change of the voltage value of the power supply output terminal.

The first detection circuit 54 comprises a third resistor R3, a fourth resistor R4, a second DC voltage source U2, a second voltage comparator A2, and a fifth resistor R5. The third resistor R3 comprises a third resistor R3 first terminal and a third resistor R3 second terminal. The fourth resistor R4 comprises a fourth resistor R4 first terminal and a fourth resistor R4 second terminal. The second voltage comparator A2 comprises a second voltage comparator A2 positive input terminal, a second voltage comparator A2 reverse input terminal, and a second voltage comparator A2 output terminal. The fifth resistor R5 comprises a fifth resistor R5 first terminal and a fifth resistor R5 second terminal. In at least one embodiment the output voltage of the second DC voltage source U2 is 2.5V.

The first voltage comparator A1 reverse input terminal is coupled to the triangular wave generator 41. The first voltage comparator A1 positive input terminal is coupled to the second resistor R2 first terminal. The second resistor R2 first terminal is also coupled to the first resistor R1 first terminal. The second resistor R2 second terminal is coupled to a positive electrode of the first DC voltage source U1. A negative electrode of the first DC voltage source U1 is coupled to ground. The first voltage comparator A1 output terminal is coupled to the first MOS tube Q1 gate G. The first voltage comparator A1 is also coupled the second MOS tube Q2 gate G through an inverter T1. The first MOS tube Q1 source S is coupled to the second MOS tube Q2 drain D. The first MOS tube Q1 drain D is coupled to the power supply output terminal 50. The second MOS tube Q2 source S is coupled to ground. The first voltage comparator A1 positive input terminal is also coupled to the fifth resistor R5 first terminal. The fifth resistor R5 second terminal is coupled to the second voltage comparator A2 output terminal. In at least one embodiment, the resistance value of the second resistor R2 is smaller than the resistance value of the fifth resistor R5, so that the second resistor R2 and the fifth resistor R5 constitute a voltage dividing circuit. The fifth resistor R5 may be assigned a larger voltage value. The second voltage comparator A2 positive input terminal is coupled to the fourth resistor R4 first terminal. The fourth resistor R4 is coupled to ground. The fourth resistor R4 first terminal is also coupled to the third resistor R3 first terminal. The third resistor R3 second terminal is coupled to the power supply output terminal 50. The second voltage comparator A2 reverse input terminal is coupled to the positive electrode of the second DC voltage source U2. The negative electrode of the second DC voltage source U2 is grounded.

Figure 3:
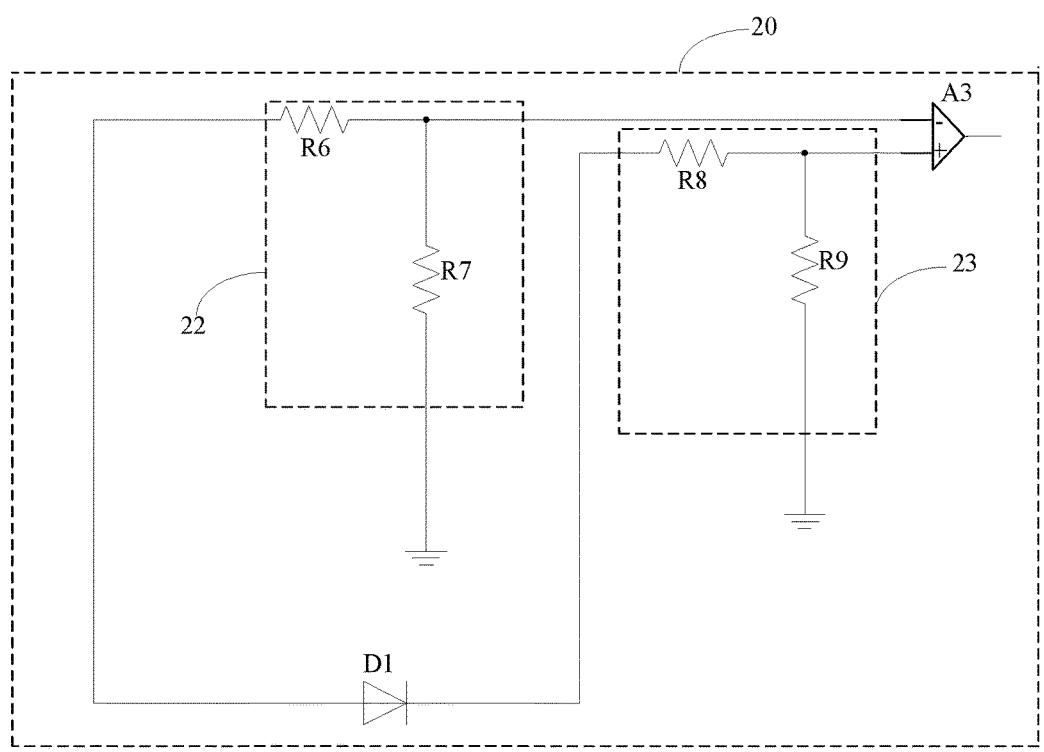
FIG. 3 is a circuit diagram of an embodiment of a detection circuit in the control circuit of FIG. 1.

FIG. 3 illustrates a circuit diagram of an embodiment of the detection circuit 20. In at least one embodiment, the detection circuit 20 comprises a diode D1, a third voltage comparator A3, a second detection circuit 22, and a third detection circuit 23. The third voltage comparator A3 comprises a third voltage comparator A3 positive input terminal, a third voltage comparator A3 reverse input terminal, and a third voltage comparator A3 output terminal. The second detection circuit 22 comprises a second detection circuit 22 first terminal and a second detection circuit 22 second terminal. The third detection circuit 23 comprises a third detection circuit 23 first terminal and a third detection circuit 23 second terminal. The second detection circuit 22 first terminal is coupled to the diode D1 anode. The second detection circuit 22 second terminal is coupled to the third voltage comparator A3 reverse input terminal. The second detection circuit 22 is configured to detect the voltage value of the diode D1 anode. The second detection circuit 22 first terminal is coupled to the diode D1 anode. The third detection circuit 23 first terminal is coupled to the diode D1 cathode. The third detection circuit 23 second terminal is coupled to the third voltage comparator A3 positive input terminal. The third detection circuit 23 is configured to detect the voltage value of the diode D1 cathode. The third voltage comparator A3 determines whether the power supply circuit is powered normally according to the voltage value across the diode D1. The second detection circuit 22 comprises a sixth resistor R6 and a seventh resistor R7. The sixth resistor R6 comprises a sixth resistor R6 first terminal and a sixth resistor R6 second terminal. The seventh resistor R7 comprises a seventh resistor R7 first terminal and a seventh resistor R7 second terminal. The third detection circuit 23 comprises an eighth resistor R8 and a ninth resistor R9. The eighth resistor R8 comprises an eighth resistor R8 first terminal and an eighth resistor R8 second terminal. The ninth resistor R9 comprises a ninth resistor R9 first terminal and a ninth resistor R9 second terminal. The ratio of the resistance values of the sixth resistor R6 and the seventh resistor R7 is equal to the ratios of the resistance value of the eighth resistor R8 and the ninth resistor R9.

The diode D1 anode is coupled to the sixth resistor R6 first terminal. The sixth resistor R6 second terminal is coupled to the seventh resistor R7 first terminal. The seventh resistor R7 is grounded. The sixth resistor R6 second terminal is also coupled to the third voltage comparator A3 reverse input terminal. The third voltage comparator A3 positive input terminal is coupled to the ninth resistor R9 first terminal. The ninth resistor R9 second terminal is grounded. The ninth resistor R9 first terminal is also coupled to the eighth resistor R8 first terminal. The eighth resistor R8 second terminal is coupled to the diode D1 cathode.

Figure 4:
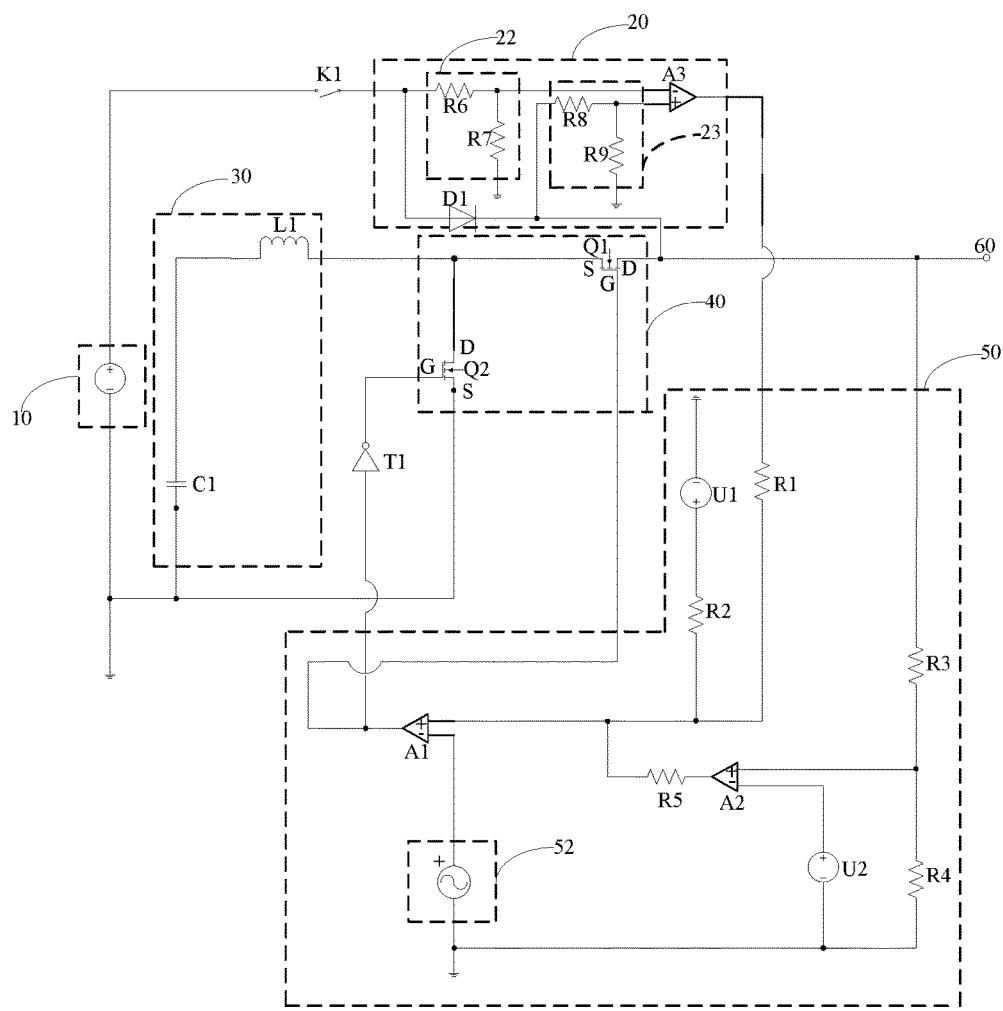
FIG. 4 is a circuit diagram of the control circuit of FIG. 1.

FIG. 4 illustrates a circuit diagram of the power continuation control circuit 1. In at least one embodiment, the switch K1 is an element for simulating whether the power supply circuit 40 is normal or abnormal.

In at least one embodiment, the power supply continuation control circuit 1 detects power supply status of the power supply circuit 10 by the detection circuit 20. When the power supply circuit 10 is powered normally, the switch K1 is turned on. The voltage outputted from the power supply circuit 10 is supplied to the external device through the diode D1 and the power supply output terminal 60. The voltage outputted from the power supply circuit 10 is divided in sequence through the diode D1 and the voltage dividing circuit composed of the third resistor R3 and the fourth resistor R4, so that the voltage value of the second voltage comparator A2 positive input terminal is larger than the voltage value of the second voltage comparator A2 reverse input terminal. The second voltage comparator A2 outputs a high level, causing the fifth resistor R5 to be open. At the same time, the second detection circuit 22 composed of the sixth resistor R6 and the seventh resistor R7 and the third detection circuit 23 composed of the eighth resistor R8 and ninth resistor R9 respectively detect the voltage across the diode D1. Since the diode D1 has a voltage drop of about 0.7 V and the ratio of the resistance values of the sixth resistor R6 and the seventh resistor R7 is equal to the ratio of the resistance values of the eighth resistor R8 and the ninth resistor R9. Therefore, when the power supply circuit 10 is powered normally, the voltage value of the third voltage comparator A3 reverse input terminal is larger than the voltage value of the third voltage comparator A3 reverse input terminal voltage. The third voltage comparator A3 outputs a low level voltage. The first resistor R1 and the second resistor R2 constitute a voltage dividing circuit for dividing the first DC voltage source U1 (5V), so that the voltage the first voltage comparator A1 positive input terminal is 2.5 V. The first voltage comparator A1 compares a voltage value of the positive input terminal and a voltage value of reverse input terminal to output a square wave having a duty ratio of 50%. The reverse input terminal is coupled to the triangular wave generator 41 which outputs a triangular wave having a frequency of 100 KHz and a amplitude of 5V. The square wave control MOS tube Q1 is turned on in the first half time period as the MOS tube Q2 is turned off in the first half time period. The MOS tube Q1 is turned off in the following half time period, and the MOS tube Q2 is turned on in the following half time period. When the MOS tube Q1 is turned on, the power supply output terminal 50 supplies power to the capacitor C1 by the MOS tube Q1 and the inductor L2. When the MOS tube Q2 is turned on, the capacitor C1, the inductor L1, and the MOS tube Q2 form a discharge circuit so that the capacitor C1 transfers the discharged energy into the inductor L1.

When the power supply circuit 10 is abnormally powered, the switch K2 is turned off. The voltage value of the third voltage comparator A3 reverse input terminal becomes 0V. The third voltage comparator A3 positive input terminal has a voltage supplied by the energy storage circuit 30. Thus, the third voltage comparator A3 outputs a high level voltage, causing the resistor R1 to be open. The energy storage circuit 30 thus supplies power to the external device, since the MOS tube Q1 is turned on in the first half time period, and is turned off in the following half time period. As the energy supply continues, the energy supplied by the energy storage circuit 30 in one half of a cycle does not reach the supply voltage of the external device, causing the voltage value of the second voltage comparator A2 reverse input terminal to be reduced. The second voltage comparator A2 outputs a low level voltage. The second resistor R2 and the fifth resistor R5 constitute a voltage dividing circuit to divide the first DC voltage source U1 so that the voltage value of the first voltage comparator A1 reverse input terminal is larger than 2.5 V, and a duration of the first voltage comparator A1 outputting the high level voltage becomes longer. The conduction time of the MOS tube Q1 in a time period is extended, thus ensuring the energy storage circuit 30 supply power in a stable manner to the external equipment.

Many details are often found in the art such as the other features of the power continuation control circuit. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:
1. A power continuation control circuit comprising:
   a power supply circuit configured to output a preset voltage;
   a detection circuit coupled to the power supply circuit, and configured to obtain the voltage outputted by the power supply circuit to determine whether the power supply circuit is powered normally;
   an energy storage circuit configured to store energy;
   a switch module coupled to the energy storage circuit, wherein the switch module comprises a first electronic switch and a second electronic switch;
   a control circuit coupled to the switch module and the detection circuit, and configured to output a first square wave signal with a first preset duty ratio according to a first signal outputted by the detection circuit, to control the first electronic switch and the second electronic switch to turn on or off resulting in that the energy storage circuit stores energy, and further configured to output a second square wave signal with a second preset duty ratio according to a second signal outputted by the detection circuit, to control the first electronic switch and the second electronic switch to turn on or off resulting in that the energy storage circuit supplies energy, wherein the control circuit comprises:
      a DC voltage output unit coupled to the detection circuit, and configured to output a first voltage signal when the first signal is outputted by the detection circuit, and further configured to output a second voltage signal when the second signal is outputted by the detection circuit;

a triangle wave generator configured to produce a triangular wave with preset amplitude and frequency; and a voltage comparison unit coupled to the triangle wave generator and the DC voltage output unit, and configured to compare one of the first voltage signal and the second voltage signal outputted by the DC voltage output unit with the triangular wave, and further configured to output the square wave signal of the first preset duty ratio according the first voltage signal or the square wave signal of the second preset duty ratio according to the second voltage signal; and a power supply output terminal coupled to the control circuit and the power supply circuit, and configured to supply power to an external device.

2. The power continuation control circuit of claim 1, wherein the voltage comparison unit comprises a first voltage comparator, and the DC voltage output unit comprises:

a first resistor with a first resistor first terminal and a first resistor second terminal, wherein the first resistor first terminal is coupled to the detection circuit;

a first DC voltage source; and a second resistor with a second resistor first terminal and a second resistor second terminal, wherein the second resistor first terminal is coupled to the first resistor second terminal, and the second resistor second terminal is coupled to a positive electrode of the first DC voltage source.

3. The power continuation control circuit of claim 2, wherein the control circuit further comprises:

a first detection circuit coupled to the first voltage comparator positive input terminal, and configured to detect a voltage value of the power supply output terminal and to adjust the voltage value of the first voltage comparator positive input terminal according to a change of the voltage value of the power supply output terminal.

4. The power continuation control circuit of claim 3, wherein the first detection circuit comprises:

a third resistor with a third resistor first terminal and a third resistor second terminal, wherein the third resistor first terminal is coupled to the power supply output terminal;

a fourth resistor with a fourth resistor first terminal and a fourth resistor second terminal, wherein the fourth resistor first terminal is coupled to the third resistor second terminal, and the fourth resistor second terminal is coupled to the ground;

a second DC voltage source;

a second voltage comparator with a second voltage comparator positive input terminal, a second voltage comparator reverse input terminal and a second voltage comparator output terminal, the second voltage comparator positive input terminal coupled to the fourth resistor first terminal, the second voltage comparator reverse input terminal coupled to a positive electrode of the second DC voltage source; and a fifth resistor with a fifth resistor first terminal and a fifth resistor second terminal, the fifth resistor first terminal coupled to the second voltage comparator output terminal, the fifth resistor second terminal coupled to the first voltage comparator positive input terminal.

5. The power continuation control circuit of claim 4, wherein the resistance value of the second resistor is smaller than the resistance value of the fifth resistor.

6. The power continuation control circuit of claim 1, wherein the energy storage circuit comprises:

an inductor with an inductor first terminal and an inductor second terminal coupled to the switch module; and a capacitor with a capacitor first terminal coupled to the inductor first terminal, and a capacitor second terminal coupled to the ground.

7. A power continuation control circuit comprising:

a power supply circuit configured to output a preset voltage;

a detection circuit coupled to the power supply circuit, and configured to obtain the preset voltage outputted by the power supply circuit to determine whether the power supply circuit is powered normally;

an energy storage circuit configured to store energy;

a switch module coupled to the energy storage circuit, wherein the switch module comprises a first electronic switch and a second electronic switch;

a control circuit coupled to the switch module and the detection circuit, and configured to output a first square wave signal with a first preset duty ratio according to a first signal outputted by the detection circuit, to control the first electronic switch and the second electronic switch to turn on or off resulting in that the energy storage circuit stores energy, and further configured to output a second square wave signal with a second preset duty ratio according to a second signal outputted by the detection circuit, to control the first electronic switch and the second electronic switch to turn on or off resulting in that the energy storage circuit supplies energy; and a power supply output terminal coupled to the control circuit and the power supply circuit, and configured to supply power to an external device, wherein the detection circuit comprises:

a diode;

a third voltage comparator with a third voltage comparator positive input terminal, a third voltage comparator reverse input terminal and a third voltage comparator output terminal, configured to judge whether the power supply circuit is powered normally according to a voltage difference between a voltage value of an anode of the diode and a voltage value of a cathode of the diode a second detection circuit comprises a second detection circuit first terminal and a second detection circuit second terminal, the second detection circuit first terminal coupled to the anode of the diode, the second detection circuit second terminal coupled to the third voltage comparator reverse input terminal, and configured to detect the voltage value of the anode of the diode; and a third detection circuit comprises a third detection circuit first terminal and a third detection circuit second terminal the third detection circuit first terminal coupled to the cathode of the diode, the third detection circuit second terminal coupled to the third voltage comparator positive input terminal, and configured to detect the voltage value of the cathode of the diode.

8. The power continuation control circuit of claim 7, wherein the second detection circuit comprises:

a sixth resistor with a sixth resistor first terminal and a sixth resistor second terminal, the sixth resistor first terminal coupled to the anode of the diode, the sixth resistor second terminal coupled to the third voltage comparator reverse input terminal;

a seventh resistor with a seventh resistor first terminal and a seventh resistor second terminal, the seventh resistor first terminal coupled to the third voltage comparator reverse input terminal, the seventh resistor second terminal coupled to the ground;

wherein the second detection circuit comprises:

an eighth resistor with an eighth resistor first terminal and an eighth resistor second terminal, the eighth resistor first terminal coupled to the cathode of the diode, the eighth resistor second terminal coupled to the third voltage comparator positive input terminal; and a ninth resistor with a ninth resistor first terminal and a ninth resistor second terminal, the ninth resistor first terminal coupled to the third voltage comparator positive input terminal, the ninth resistor second terminal coupled to the ground.

9. The power continuation control circuit of claim 8, wherein the ratio of the resistance value of the sixth resistor and the seventh resistor is equal to the ratio of the resistance value of the eighth resistor and the ninth resistor.

10. The power continuation control circuit of claim 7, wherein the energy storage circuit comprises:

an inductor with an inductor first terminal and an inductor second terminal coupled to the switch module; and a capacitor with a capacitor first terminal coupled to the inductor first terminal, and a capacitor second terminal coupled to the ground.

* * * * *